United States Patent
Chae et al.

(10) Patent No.: US 7,629,244 B2
(45) Date of Patent: Dec. 8, 2009

(54) METHOD OF FABRICATING A SINGLE ELECTRON TRANSISTOR HAVING MEMORY FUNCTION

(75) Inventors: Soo-doo Chae, Seongnam (KR); Chung-woo Kim, Seongnam (KR); Ju-hyung Kim, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 279 days.

(21) Appl. No.: 11/491,281

(22) Filed: Jul. 24, 2006

(65) Prior Publication Data

US 2006/0255368 A1 Nov. 16, 2006

Related U.S. Application Data

(62) Division of application No. 10/773,288, filed on Feb. 9, 2004, now Pat. No. 7,105,874.

(30) Foreign Application Priority Data

Feb. 7, 2003 (KR) ................................ 2003-7758

(51) Int. Cl.
*H01L 21/4763* (2006.01)
(52) U.S. Cl. ........................ 438/591; 438/197; 438/479; 257/E39.013; 257/E29.322; 257/E49.003
(58) Field of Classification Search ................. 438/591, 438/479, 197; 257/E39.013, E29.322, E49.003
See application file for complete search history.

(56) References Cited

U.S. PATENT DOCUMENTS 4,544,617 A * 10/1985 Mort et al. .................. 430/57.7
6,211,013 B1 4/2001 Park et al.

FOREIGN PATENT DOCUMENTS

JP 06-196720 7/1994

* cited by examiner

*Primary Examiner*—Long Pham
(74) *Attorney, Agent, or Firm*—Lee & Morse, P.C.

(57) ABSTRACT

A single electron transistor having a memory function and a fabrication method thereof are disclosed. In the single electron transistor, a first substrate and an insulation film are sequentially stacked, a second substrate is stacked on the insulation film and includes a source region, a channel region, and a drain region, a tunneling film is formed on the second substrate, at least two trap layers are formed on the tunneling film and are separated by an interval such that at least one quantum dot may be formed in a same interval in the channel region, and a gate electrode is formed to contact the at least two trap layers and the tunneling film between the at least two trap layers. Because the single electron transistor is simple and includes a single gate electrode, a fabricating process and an operational circuit thereof may be simplified, and power consumption may be reduced.

5 Claims, 11 Drawing Sheets

METHOD OF FABRICATING A SINGLE ELECTRON TRANSISTOR HAVING MEMORY FUNCTION

CROSS REFERENCE TO RELATED APPLICATION

This is a divisional application based on application Ser. No. 10/773,288, filed Feb. 9, 2004, now U.S. Pat. No. 7,105,874 the entire contents of which is hereby incorporated by reference.

BACKGROUND OF THE INVENTION

1. Field of the Invention

The present invention relates to a transistor and a method of manufacturing the same. More particularly, the present invention relates to a single electron transistor having a memory function and a method of manufacturing the single electron transistor.

2. Description of the Related Art

In memory devices comprised of a quantum dot junction or a single electron junction having a size of 0.1 nm or less, the movement of an individual electron may be controlled by adjusting an external source voltage. This is called a single electron effect. A transistor using the single electron effect is referred to as a single electron transistor (SET).

An SET is comprised of a nano-sized quantum dot formed between a source and a drain and a gate electrode electrocapacitively coupled to the quantum dot.

Figure 1:
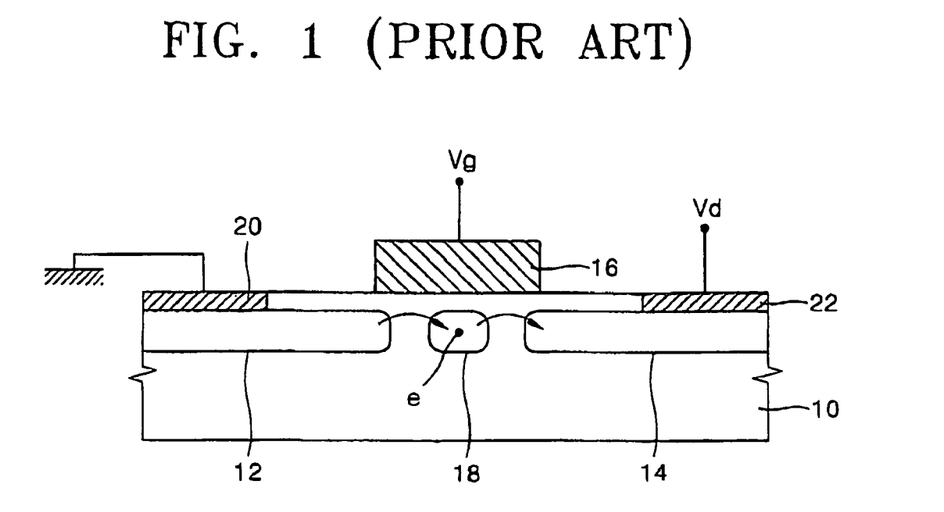
FIGS. 1 and 2 illustrate cross-sectional views of two conventional single electron transistors.

Referring to FIG. 1, in a conventional single electron transistor, a gate electrode 16 is formed on a predetermined area of an insulation layer 10. Portions of predetermined thicknesses of the insulation layer 10 are removed from both sides of the gate electrode 16, and first and second conductive films 20 and 22 are formed on the resultant empty spaces formed by the removal of portions of the insulation layer 10. A source region 12 exists in a portion of the insulation layer 10 under the first conductive film 20, and a drain region 14 exists in a portion of the insulation layer 10 under the second conductive film 22. The source and drain regions 12 and 14 each extend to respective areas under the gate electrode 16. A quantum dot 18, in which an electron (e) is trapped, exists in a portion of the insulating layer 10 under the gate electrode 16 between the source and the drain regions 12 and 14.

The single electron transistor of FIG. 1 has a practical difficulty in uniformly forming the quantum dots 18 at accurate locations, thus resulting in low reproducibility.

To solve these problems, various types of single electron transistors have been developed. A cross-sectional view of one type of a single electron transistor is illustrated in FIG. 2.

Figure 2:
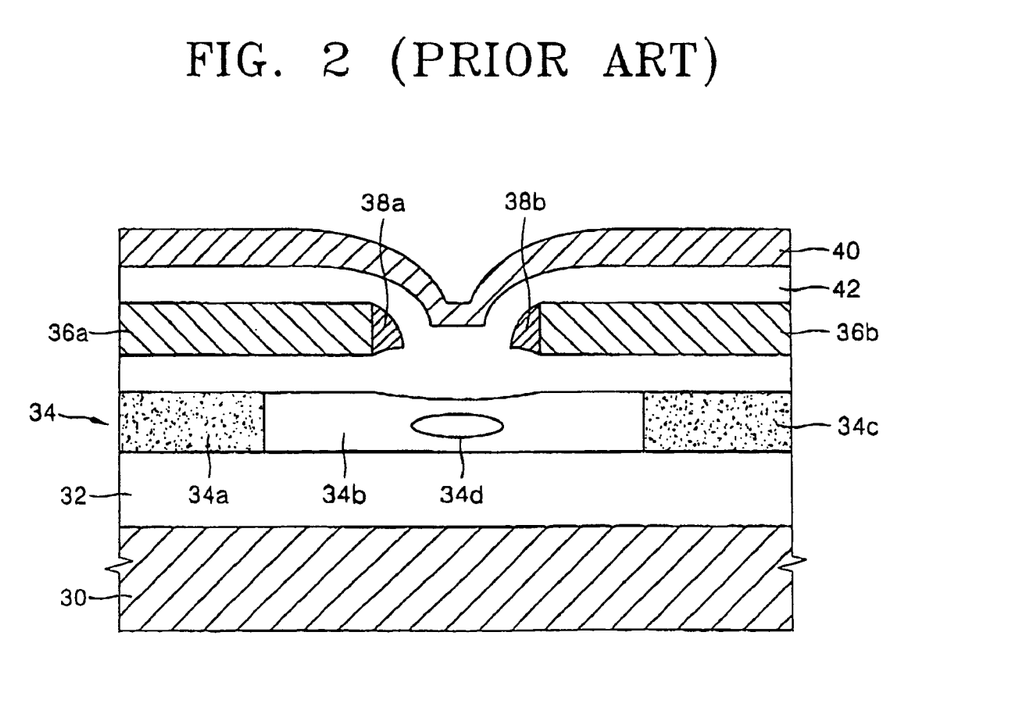

Referring to FIG. 2, an oxide film 32 exists on a substrate 30, and a silicon layer 34 exists on the oxide film 32. The silicon layer 34 is comprised of a source region 34a, a channel region 34b, and a drain region 34c. A quantum dot 34d is formed in the channel region 34b. Nitride films 36a and 36b are symmetrically placed with respect to the quantum dot 34d and are located over the silicon layer 34, but are isolated from the silicon layer 34 by a portion of an interlayer insulation film 42. The quantum dot 34d is formed by charging the nitride films 36a and 36b with electrons. Polysilicon depletion gates 38a and 38b exist in the form of spacers at facing ends of the nitride films 36a and 36b, respectively. The depletion gates 38a and 38b are isolated from each other by a distance corresponding to the size of quantum dot 34d. A polysilicon control gate 40 exists over the nitride films 36a and 36b but is isolated from the nitride films 36a and 36b and the polysilicon depletion gates 38a and 38b by another portion of the interlayer insulation film 42. A portion of the control gate 40, which exists between the depletion gates 38a and 38b, protrudes downwards toward the quantum dot 34d. The space between the silicon layer 34 and the control gate 40 and the nitride films 36a and 36b and the polysilicon depletion gates 38a and 38b is filled with the interlayer insulation film 42.

As described above, because the quantum dot 34d of the conventional single electron transistor of FIG. 2 is formed by charging the nitride films 36a and 36b with electrons, the conventional single electron transistor of FIG. 2 has a degree of reproducibility related to a single electron effect. However, since the conventional single electron transistor of FIG. 2 includes two or more gates, such as the depletion gates 38a and 38b and the control gate 40, excessive power is consumed, and an operational circuit and a manufacturing process of the conventional single electron transistor are complicated.

SUMMARY OF THE INVENTION

The present invention provides a single electron transistor structure having a memory function, for which a fabricating process and operational circuit are simplified, and which consumes low power.

The present invention also provides a method of fabricating the single electron transistor.

According to an embodiment of the present invention, there is provided a single electron transistor having a memory function, including a first substrate and an insulation film sequentially stacked on the first substrate, a second substrate stacked on the insulation film and including a source region, a channel region, and a drain region, a tunneling film formed on the second substrate, at least two trap layers formed on the tunneling film and separated by an interval such that at least one quantum dot can be formed in a same interval in the channel region, and a gate electrode contacting the at least two trap layers and the tunneling film between the at least two trap layers.

In the single electron transistor having a memory function described above, the gate electrode may extend on the at least two trap layers, which may be nitride layers or ferro-dielectric layers. Also, the insulation film and the tunneling film may be silicon oxide films. Further, the size of the at least one quantum dot is preferably 100 nm or less at room temperature.

According to another embodiment of the present invention, there is provided a single electron transistor having a memory function, including a first substrate and a first insulation film sequentially stacked on the first substrate, a second substrate stacked on the first insulation film and including a source region, a channel region, and a drain region, a second insulation film formed on the second substrate, at least two trap layers included in the second insulation film and separated by an interval such that at least one quantum dot can be formed in a same interval in the channel region, wherein electrons passing through the channel region are trapped in the at least two trap layers, and a gate electrode formed on the second insulation film.

In the single electron transistor having a memory function according to the embodiment described above, the at least two trap layers may be nitride layers or ferro-dielectric layers including PZT layers. Alternatively, the at least two trap layers may be layers selected from the group consisting of conductive material layers including a conductive silicon layer and a conductive germanium layer. The at least two trap layers may be completely covered with the second insulation film. Both the first and second insulation films may be oxide films. Further, a size of the at least one quantum dot is preferably 100 nm or less at room temperature.

According to another embodiment of the present invention, there is provided a single electron transistor having a memory function, including a first substrate and a first insulation film sequentially stacked on the first substrate, a second substrate stacked on the first insulation film and including a source region, a channel region, and a drain region, a second insulation film formed on the second substrate, a trap layer continuously formed on the second insulation film, a third insulation film formed on the trap layer, at least two fourth insulation film patterns formed on the third insulation film and having conductive spacers formed on facing ends thereof, wherein the conductive spacers are separated by an interval such that at least one quantum dot can be formed in a same interval in the channel region, a fifth insulation film formed on and between the at least two fourth insulation film patterns having the conductive spacers formed thereon, and a gate electrode formed on the fifth insulation film.

In the single electron transistor having a memory function according to the embodiment described above, the first, second and third insulation films may be silicon oxide films. The conductive spacers may be silicon spacers. A size of the at least one quantum dot is preferably 100 nm or less at room temperature.

The trap layer may be a nitride layer or a ferro-dielectric layer including a PZT layer. Each of the second insulation film, the trap layer and the third insulation film may have a same thickness. A thickness of the fifth insulation film is preferably greater than a thickness of the second insulation film and a thickness of the third insulation film.

According to another embodiment of the present invention, there is provided a single electron transistor having a memory function, including a first substrate and a first insulation film sequentially stacked on the first substrate, a second substrate stacked on the first insulation film and including a source region, a channel region, and a drain region, a second insulation film formed on the second substrate, at least two trap layer patterns having a separation distance therebetween formed on the second insulation film and in a third insulation film such that the third insulation film surrounds the at least two trap layer patterns on all surfaces except bottom surfaces thereof which contact the second insulation film, at least two fourth insulation film patterns formed on the third insulation film and having conductive spacers formed on facing ends thereof, wherein the conductive spacers are formed to be in alignment with the at least two trap layer patterns and to be separated from each other by an interval such that at least one quantum dot can be formed in a same interval in the channel region, wherein the interval corresponds to the separation distance between the at least two trap layer patterns, a fifth insulation film formed on and between the at least two fourth insulation film patterns having the conductive spacers formed thereon, and a gate electrode formed on the fifth insulation film.

In the single electron transistor having a memory function according to the embodiment described above, the at least two trap layer patterns are preferably formed of a material selected from the group consisting of conductive materials including conductive silicon and conductive germanium. However, the at least two trap layer patterns may be formed of nitride or a ferro-dielectric including PZT.

According to another embodiment of the present invention, there is provided a single electron transistor having a memory function, including a first substrate and a first insulation film sequentially stacked on the first substrate, a second substrate stacked on the first insulation film and including a source region, a channel region, and a drain region, a second insulation film formed on the second substrate, a trap layer continuously formed on the second insulation film, a third insulation film formed on the trap layer, a lower gate continuously formed on the third insulation film, a fourth insulation film formed on the lower gate, at least two upper gates formed on the fourth insulation film to be separated from each other by an interval such that at least one quantum dot can be formed in a same interval in the channel region.

In the single electron transistor having a memory function according to the embodiment described above, the first through the fourth insulation films may be oxide films. The trap layer is preferably a nitride layer or a ferro-dielectric layer including a PZT layer. However, the trap layer may be a layer selected from the group consisting of conductive material layers including conductive silicon layers and conductive germanium layers.

According to another embodiment of the present invention, there is provided a single electron transistor having a memory function, including a first substrate and a first insulation film sequentially stacked on the first substrate, a second substrate stacked on the first insulation film and including a source region, a channel region, and a drain region, a second insulation film formed on the second substrate, at least two trap layer patterns having a separation distance therebetween formed on the second insulation film and in a third insulation film such that the third insulation film surrounds the at least two trap layer patterns on all surfaces except bottom surfaces thereof which contact the second insulation film, a lower gate continuously formed on the third insulation film, a fourth insulation film formed on the lower gate, at least two upper gates formed on the fourth insulation film to be aligned with the at least two trap layer patterns, and to be separated from each other by an interval such that at least one quantum dot can be formed in a same interval in the channel region, the interval corresponding to the separation distance between the at least two trap layer patterns.

In the single electron transistor having a memory function according to the embodiment described above, the at least two trap layer patterns are preferably formed of a material selected from the group consisting of conductive materials including conductive silicon and conductive germanium. However, the trap layer patterns may be formed of nitride or a ferro-dielectric including PZT.

According to another embodiment of the present invention, there is provided a method of fabricating a single electron transistor, including sequentially stacking an insulation film and a second semiconductor layer on a first semiconductor layer, forming a tunneling film on the second semiconductor layer, forming at least two trap layers on the tunneling film to be separated from each other by an interval such that at least one quantum dot can be formed in a same interval in a predetermined region of the second semiconductor layer, forming a gate electrode in contact with the tunneling film between the at least two trap layers, and forming a source region and a drain region in the second semiconductor layer such that the source region and the drain region are separated by an interval that is greater than the interval between the at least two trap layers, wherein the source region and the drain region are each doped with conductive impurities.

In the method according to the embodiment described above, the gate electrode may be further formed on all or a portion of the exposed surfaces of the at least two trap layers. Forming the gate electrode may further include growing the tunneling film to cover the at least two trap layers and forming the gate electrode on the entire surface of the tunneling film grown on the at least two trap layers. Alternatively, forming the gate electrode may further include growing the tunneling film to cover the at least two trap layers and forming the gate electrode on a portion of the tunneling film grown on the at least two trap layers. Forming the source and the drain regions may further include forming a mask pattern on the gate electrode, and ion implanting the conductive impurities into a resultant structure on which the mask pattern has been formed. The mask pattern may be formed such that a center of the mask pattern is aligned with the interval between the at least two trap layers. Alternatively, forming the source and the drain regions may further include ion implanting the conductive impurities into a resultant structure in which the gate electrode has been formed, using the gate electrode as a mask. The at least two trap layers may be formed of a nitride or a ferro-dielectric material, each having a trap density of at least $10^{12}/cm^2$. The tunneling film may be grown to completely cover the at least two trap layers. The at least two trap layers may be formed of one material selected from the group consisting of conductive materials including conductive silicon and conductive germanium. The insulation film and the tunneling film may be formed of an oxide film. Finally, a size of the quantum dot is preferably 100 nm or less at room temperature.

As described above, because the single electron transistor of the present invention is simple and includes a single gate electrode, a fabricating process and an operational circuit thereof may be simplified, and the power consumption thereof may be reduced.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2003-7758, filed on Feb. 7, 2003, and entitled "Single Electron Transistor Having Memory Function and Method of Manufacturing the Same", is incorporated by reference herein in its entirety.

The present invention will be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the characteristics, such as shape and thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under the other layer, or one or more intervening layers may also be present. In addition, it will also be understood that when a layer is referred to as being "between" two layers, it can be the only layer between the two layers, or one or more intervening layers may also be present. The same reference numerals in different drawings represent the same element. The term 'a normal temperature' is used to describe a temperature around room temperature at which most of the semiconductor devices described herein are normally operated.

Single electron transistors according to various embodiments of the present invention will now be described with reference to FIGS. 3 through 12, and methods of fabricating the single electron transistors will be described later with reference to FIGS. 16 through 20.

Figure 3:
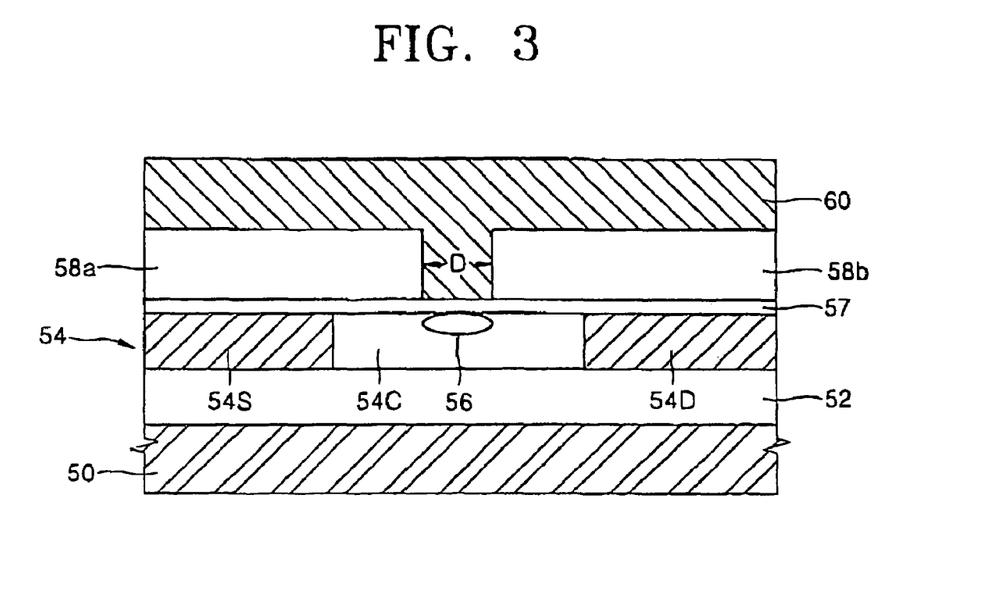
FIGS. 3 through 12 illustrate cross-sectional views of single electron transistors having a memory function, according to first through tenth embodiments of the present invention, respectively.

As shown in FIG. 3, in a single electron transistor according to a first embodiment of the present invention, a first insulation film 52 is formed to a predetermined thickness on a first substrate 50. The first insulation film 52 is a pad insulation film, which may be a buried oxide film such as a silicon oxide film. The single electron transistor is formed on the first insulation film 52.

More specifically, a second substrate 54, such as a silicon substrate, is formed on the first insulation film 52. The first insulation film 52 and the second substrate 54 form an SOI substrate. The second substrate 54 is doped with impurities of a first conductivity type to a predetermined concentration to allow the second substrate 54 to have conductivity. The second substrate 54 includes a source region 54S, a channel region 54C, and a drain region 54D. The channel region 54C is positioned between the source and drain regions 54S and 54D. A quantum dot 56, in which an electron may be trapped, or stored, is positioned in a predetermined portion of the channel region 54C.

The presence of the quantum dot 56 in the channel region 54C denotes an existence of an energy barrier around the quantum dot 56. While the quantum dot 56 is being formed, a quantized energy level at which an electron can be positioned is formed within the quantum dot 56. A position of the energy level depends on the height of an energy barrier that exists around the quantum dot 56. In other words, as the energy barrier around the quantum dot 56 becomes greater, a higher energy level is formed within the quantum dot 56. If the energy of an electron introduced into the quantum dot 56 is the same as an energy level formed in the quantum dot 56, the electron can penetrate the energy barrier existing around the quantum dot 56 and flow into the drain region 54D. The energy level of an electron introduced into the quantum dot 56 depends on a voltage applied to a gate electrode 60. Considering that the energy level has been quantized, it is obvious that the voltage applied to the gate electrode 60 is also quantized. In other words, because the energy level formed in the quantum dot 56 has been quantized, only when a gate voltage corresponding to a quantized energy level of the quantum dot 56 is applied, can current flow into the source and drain regions 54S and 54D; other voltages have no current.

The source and drain regions 54S and 54D are doped with impurities of a second conductivity type having a polarity that is opposite to that of the first conductivity type impurities with which the second substrate 54 was previously doped. Preferably, the concentration of the second conductivity type impurities is higher than that of the first conductivity type impurities. A second insulation film 57 for achieving electron tunnelling, preferably a silicon oxide film $SiO_2$, is formed on the entire surface of the second substrate 54. First and second trap layers 58a and 58b are formed on the second insulation film 57 and are separated from each other by a predetermined distance (D). The first and second trap layers 58a and 58b are dielectric layers that each have a trap site, in which an electron may be trapped, at a predetermined density, e.g., $10^{12}/cm^2$ or greater. The first and second trap layers 58a and 58b may be formed of nitride (SiN) or PZT. If the trap site density is satisfied, ferro-dielectric materials other than PZT may also be used to form the first and second trap layers 58a and 58b. The gate electrode 60 is formed to a predetermined thickness on the first and second trap layers 58a and 58b and fills the gap between the first and second trap layers 58a and 58b.

Figure 13A:
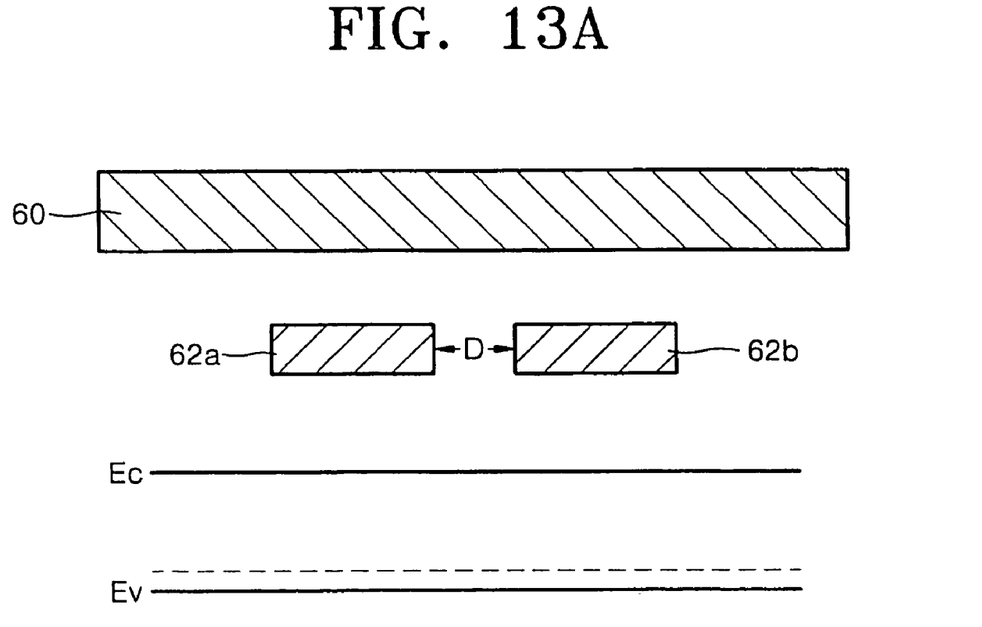
FIGS. 13A and 13B illustrate cross-sectional views for showing energy barriers that exist in a channel region before and after trap layers of a single electron transistor having a memory function according to an embodiment of the present invention are charged with electrons, respectively.
Figure 13B:
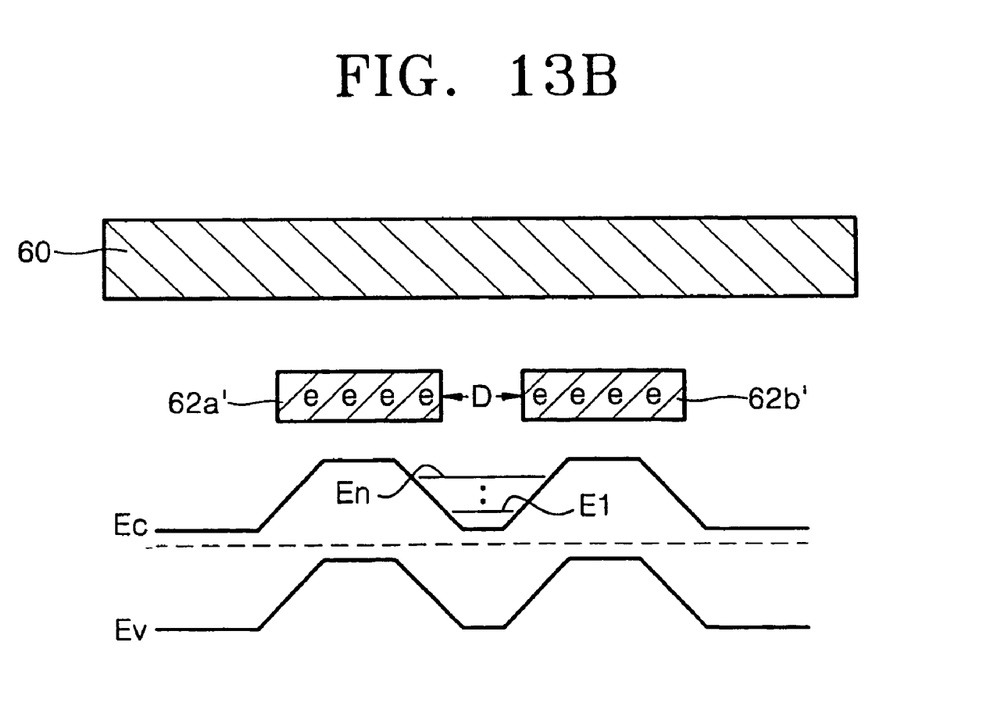

If a high voltage is applied to the gate electrode 60, electrons are trapped in the first and second trap layers 58a and 58b due to the coupling of the channel region 54C with the gate electrode 60. When the first and second trap layers 58a and 58b are charged with electrons, portions of the channel region 54C that face the first and second trap layers 58a and 58b remain as accumulation layers due to the electrons in the trap layers 58a and 58b, while the quantum dot 56 is formed in a portion of the channel region 54C that corresponds to the space between the first and second trap layers 58a and 58b. FIGS. 13A and 13B illustrate the energy band diagram of the channel region before and after trap layers are charged with electrons, respectively. Because the portion of the channel region 54C in which the quantum dot 56 has been formed is not charged with electrons, the portion in which the quantum dot 56 has been formed is turned into an inversion layer. Because the accumulation layer functions as a barrier, an energy barrier, as shown by a valence band energy barrier Ev and a conduction band energy barrier Ec in FIG. 13B, is formed around the quantum dot 56. In FIG. 13B, reference numerals E1 and En denote a first energy level and an n-th energy level, respectively, of the quantum dot 56 at which electrons may be positioned. Reference numerals 62a' and 62b' denote third and fourth trap layers, respectively, charged with electrons, which will be discussed later with respect to FIG. 5. However, the energy barrier and energy levels of FIG. 13B apply equally to the single electron transistor of the first embodiment of the present invention having first and second trap layers 58a and 58b illustrated in FIG. 3. Similarly, FIG. 13A illustrates the third and fourth trap layers 62a and 62b when not charged with the electrons, and apply equally to first and second trap layers 58a and 58b of FIG. 3. FIGS. 13A and 13B will be described later in greater detail.

As described above, since the gate voltage is also quantized by energy levels E1 through En formed in the quantum dot 56 while the first and second trap layers 58a and 58b are charged with electrons, the transistor of FIG. 3 may be expected to operate as a single electron transistor (SET).

Preferably, the size of the quantum dot 56 is 100 nm or less to make the transistor of FIG. 3 operate as an SET at a normal temperature. Hence, it is preferable that the distance (D) between the first and second trap layers 58a and 58b, which determines the size of the quantum dot 56, is 100 nm or less at a normal temperature. At a temperature higher than a normal temperature, the quantum dot 56 may have a size of 100 nm or greater to make the transistor of FIG. 3 operate as an SET.

Hereinafter, remaining embodiments of the present invention will be described with respect to FIGS. 4-12. Elements that are the same as those of the single electron transistor according to the first embodiment of the present invention are indicated by the same reference numerals or symbols as those used in FIG. 3. Also, elements that have been previously described may not be described again. This rule may be applied equally to all remaining embodiments.

Figure 4:
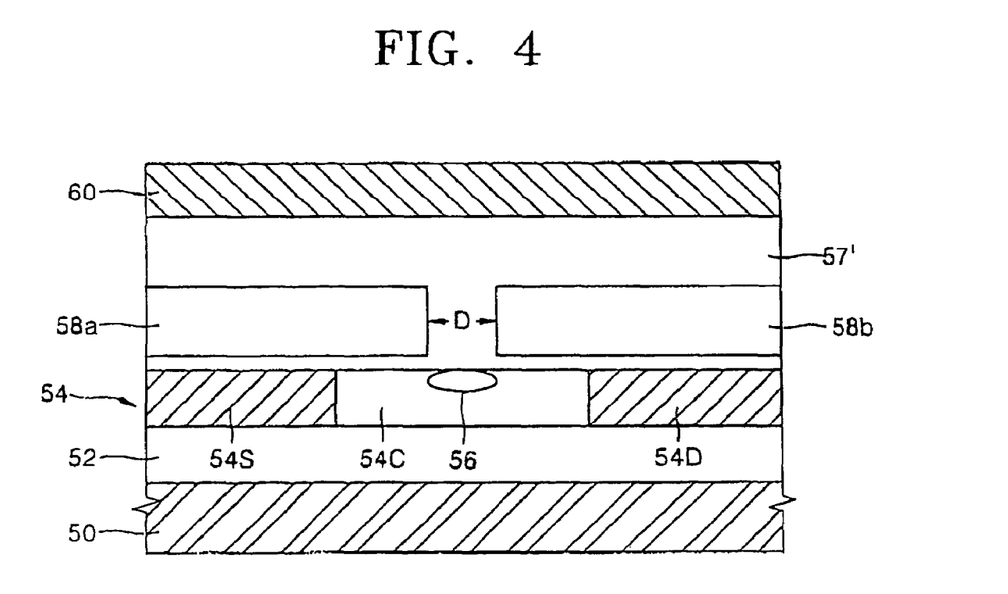

Referring to FIG. 4, in a single electron transistor according to a second embodiment of the present invention, the first insulation film 52 is formed on the first substrate 50, and the second substrate 54 having source, channel, and drain regions 54S, 54C, and 54D, respectively, is formed on the first insulation film 52. A second insulation film 57' is formed on the second substrate 54. The second insulation film 57' in the second embodiment has regions that are significantly thicker than the second insulation film 57 in the first embodiment. First and second trap layers 58a and 58b are included in the second insulation film 57' of the second embodiment, while maintaining the same separation distance therebetween as the distance (D) in the first embodiment. The second insulation film 57' of FIG. 4 is formed on and between the first and second trap layers 58a and 58b. The second insulation film 57' of FIG. 4 has a flat uppermost surface. A gate electrode 60 is formed on the flat uppermost surface of the second insulation film 57'.

Figure 5:
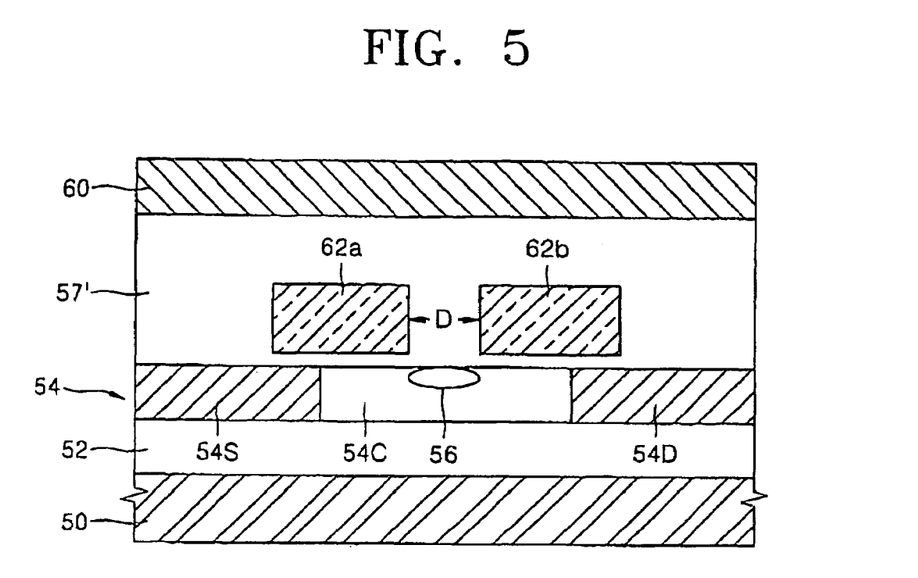

Referring to FIG. 5, a single electron transistor according to a third embodiment of the present invention has a same structure as that of the second embodiment except in respect to the trap layers. In the third embodiment of the present invention, third and fourth trap layers 62a and 62b, having different properties of matter than the first and second trap layers 58a and 58b of the second embodiment, are included in the second insulation film 57'. The third and fourth trap layers 62a and 62b are separated from each other by the same interval as the distance (D) between the first and second trap layers 58a and 58b of FIG. 4. The third and fourth trap layers 62a and 62b are preferably conductive material layers that have a predetermined trap site density, for example, conductive silicon or germanium layers. Since the third and fourth trap layers 62a and 62b are conductive, they are separated from third and fourth trap layers included in transistors that are adjacent thereto (not shown), whereas the first and second trap layers 58a and 58b of FIG. 4 are connected to first and second trap layers included in transistors that are adjacent thereto (also not shown).

Figure 6:
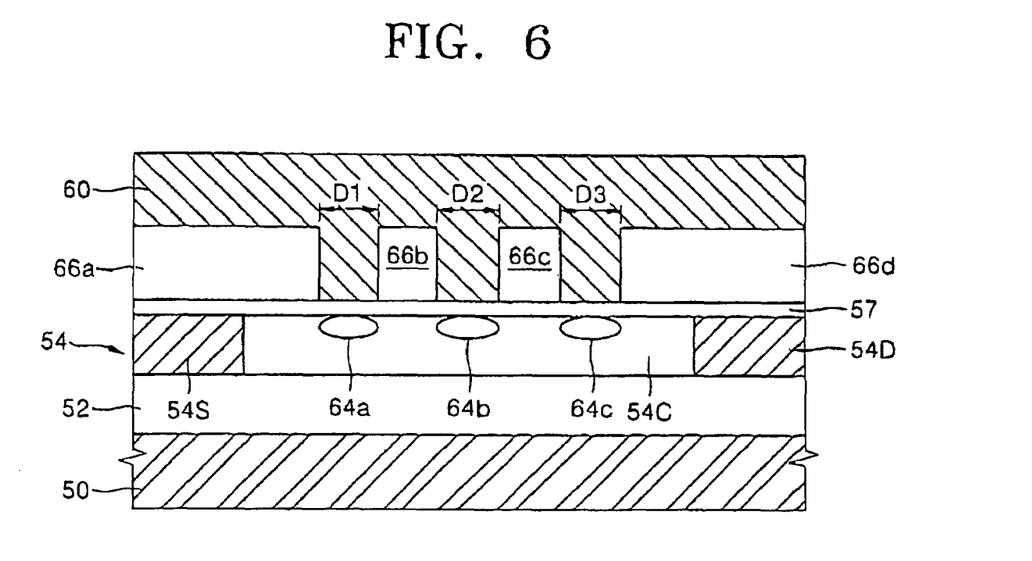

In contrast with the first through third embodiments, a single electron transistor according to a fourth embodiment of the present invention includes trap layers such that a plurality of quantum dots may be formed in the channel region 54C.

More specifically, referring to FIG. 6, a first insulation film 52, a second substrate 54, and a second insulation film 57 are sequentially stacked on a first substrate 50. Fifth through eighth trap layers 66a, 66b, 66c, and 66d are formed to a predetermined thickness on the second insulation film 57. The fifth trap layer 66a is formed on a portion of the second insulation film 57 above the source region 54S and part of the channel region 54C that is adjacent to the source region 54S, whereas the eighth trap layer 66d is formed on a portion of the second insulation film 57 above the drain region 54D and a portion of the channel region 54C that is adjacent to the drain region 54D. The sixth and seventh trap layers 66b and 66c are formed on portions of the second insulation film 57 above the channel region 54C between the fifth and eighth trap layers 66a and 66d. The fifth and sixth trap layers 66a and 66b are separated from each other by a first distance D1, the sixth and seventh trap layers 66b and 66c are separated from each other by a second distance D2, and the seventh and eighth trap layers 66c and 66d are separated from each other by a third distance D3. While the fifth through eighth trap layers 66a through 66d are being charged with electrons, first through third quantum dots 64a, 64b, and 64c are formed in the channel region 54C between two adjacent fifth through eighth trap layers 66a through 66d. Accordingly, it is preferable that the first, second, and third distances D1, D2, and D3 have values such that the first through the third quantum dots 64a, 64b, and 64c, respectively, may be formed in the channel region 54C. For example, it is preferable that the first, second, and third distances D1, D2, and D3 are 100 nm or less at a normal temperature. At a temperature higher than the normal temperature, the first, second, and third distances D1, D2, and D3 may be reduced from 100 nm or less. The fifth through eighth trap layers 66a, 66b, 66c, and 66d are covered with a gate electrode 60, which also contacts the second insulation film 57 via gaps between adjacent trap layers having the first, second, and third separation distances D1, D2, and D3, respectively.

Figure 7:
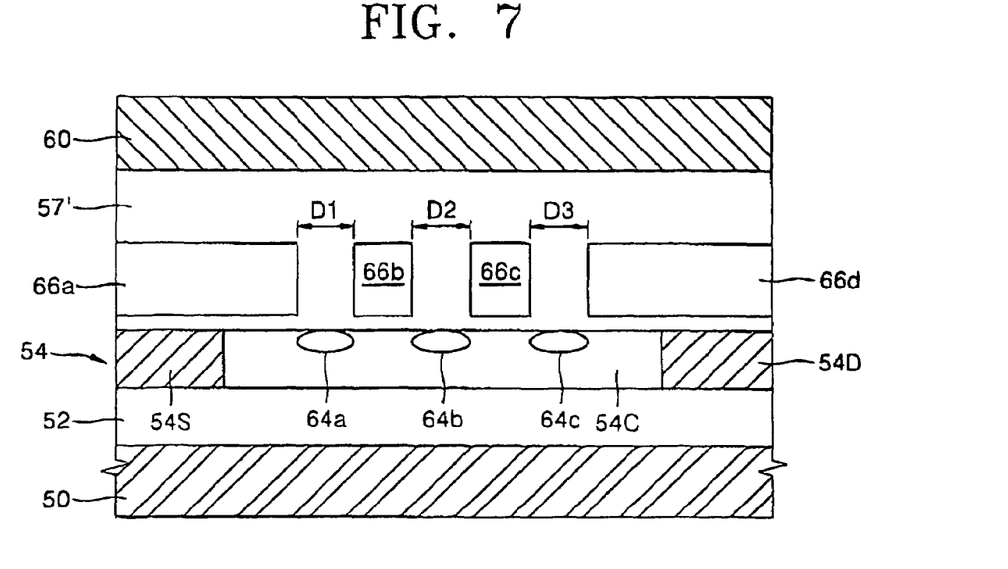

Referring to FIG. 7, in a single electron transistor according to a fifth embodiment of the present invention, the fifth through eighth trap layers 66a through 66d are covered with a second insulation film 57' that is grown between the fifth through eighth trap layers 66a through 66d via the separation distances D1, D2, and D3 therebetween. The gate electrode 60 is formed on a flat uppermost surface of the second insulation film 57'.

Figure 8:
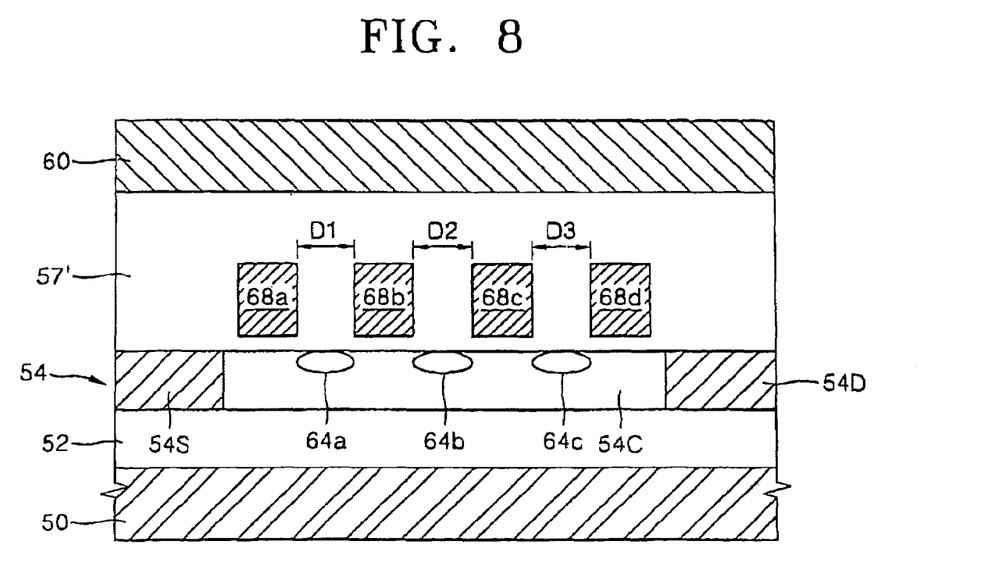

Referring to FIG. 8, a single electron transistor according to a sixth embodiment of the present invention has a same structure as that of the fifth embodiment of FIG. 7, except that ninth through twelfth trap layers 68a through 68d, instead of the fifth through eighth trap layers 66a through 66d of the fifth embodiment, are included in the second insulation film 57'. The ninth through twelfth trap layers 68a through 68d perform the same function as the fifth through eighth trap layers 66a through 66d of the fifth embodiment. However, the ninth through twelfth trap layers 68a through 68d are preferably conductive material layers that have a predetermined trap site density, such as conductive silicon layers or germanium layers.

Figure 9:
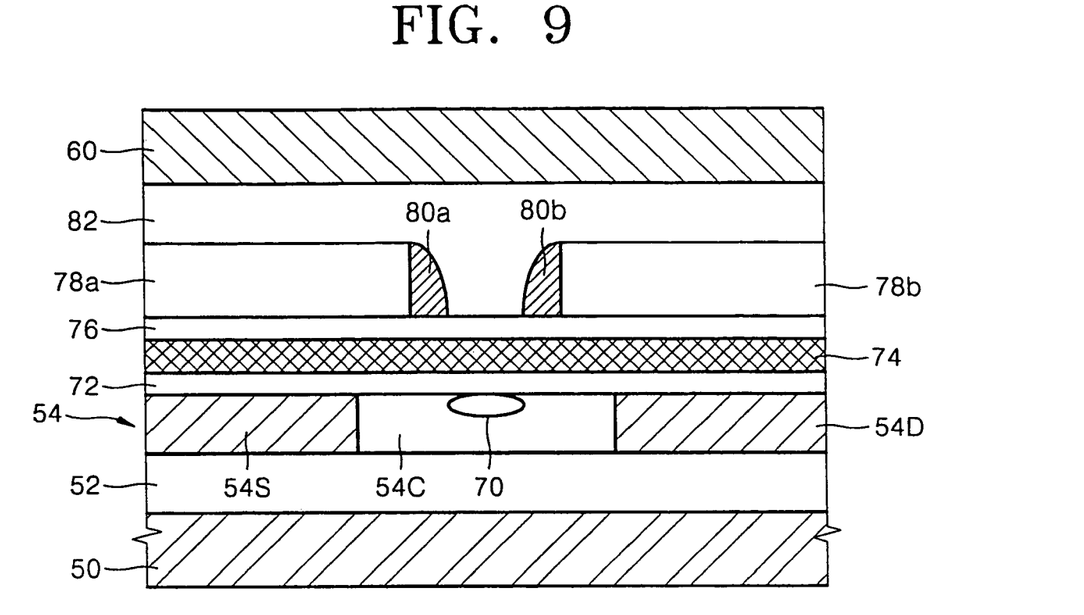

Referring to FIG. 9, in a single electron transistor according to a seventh embodiment of the present invention, a first insulation film 52, a second substrate 54, a third insulation film 72, a thirteenth trap layer 74, and a fourth insulation film 76 are sequentially stacked on a first substrate 50. Here, the second substrate 54 includes source, channel, and drain regions 54S, 54C, and 54D, respectively. The third insulation film 72 is preferably a tunnelling oxide film, such as a silicon oxide film. The fourth insulation film 76 is preferably a silicon oxide film, which prevents electrons trapped in the thirteenth trap layer 74 from escaping therefrom. The thirteenth trap layer 74 may be a dielectric layer having a predetermined trap site density such as to trap electrons. For example, the thirteenth trap layer 74 may be a SiN or a PZT layer having a trap site density of $10^{12}/cm^2$ or greater. The third and fourth insulation films 72 and 76 and the thirteenth trap layer 74 preferably are formed to have equal thicknesses.

Thereafter, two insulation film patterns 78a and 78b are positioned on a predetermined region of the fourth insulation film 76 and spaced a predetermined interval apart from each other. The two insulation film patterns 78a and 78b are formed over the source and drain regions 54S and 54D, respectively, starting from a predetermined portion of the third insulation film 76 over the channel region 54C. First and second conductive spacers 80a and 80b are formed on facing ends of the two insulation film patterns 78a and 78b, respectively. Preferably, the first and the second conductive spacers 80a and 80b, which serve as floating gates, are silicon (Si) layers. The first and second conductive spacers 80a and 80b are separated from each other by a predetermined interval. While the thirteenth trap layer 74 is being charged with electrons, a fourth quantum dot 70 having a size corresponding to the interval between the first and the second conductive spacers 80a and 80b is formed in the channel region 54C. Accordingly, it is preferable that the interval between the first and the second conductive spacers 80a and 80b is 100 nm or less at a normal temperature. The entire surface of the resultant structure in which the first and second conductive spacers 80a and 80b have been formed is covered with a fifth insulation film 82, which fills the interval between the first and the second conductive spacers 80a and 80b. Preferably, the fifth insulation film 82 is thicker than the third and the fourth insulation films 72 and 76, and has a flat uppermost surface. Then, a gate electrode 60, which is used as a control gate, is formed on the flat uppermost surface of the fifth insulation film 82.

Figure 10:
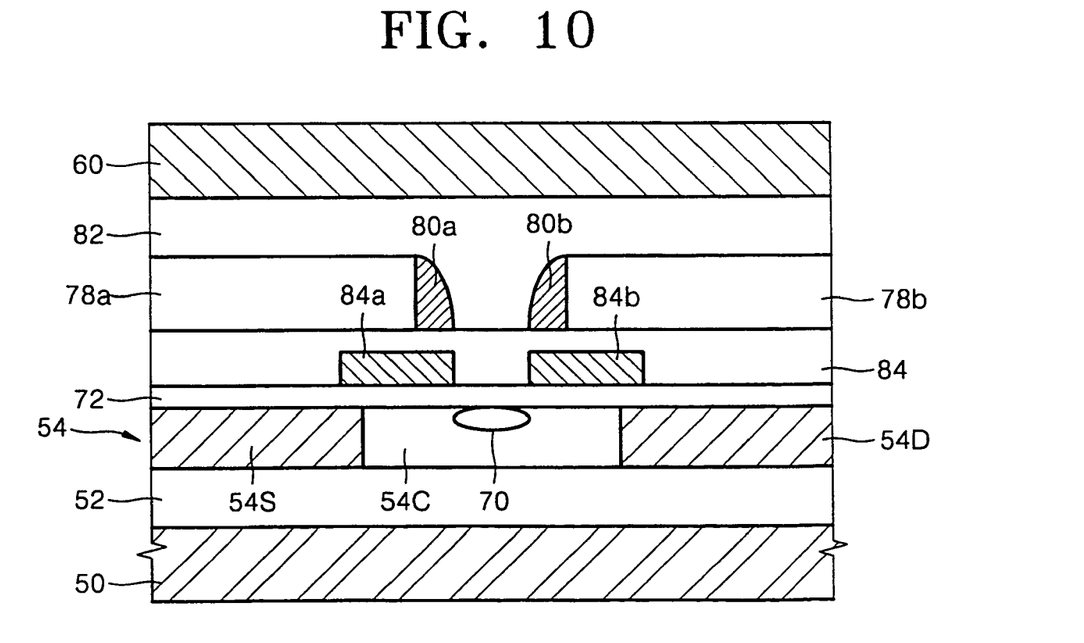

Referring to FIG. 10, a single electron transistor according to an eighth embodiment of the present invention has a same structure as that of the seventh embodiment except that fourteenth and fifteenth trap layers 84a and 84b are formed on a predetermined portion of the third insulation film 72 in place of the thirteenth trap layer 74 of the seventh embodiment. The fourteenth and fifteenth trap layers 84a and 84b are separated from each other by an interval corresponding to the size of the fourth quantum dot 70. A remaining exposed portion of the third insulation film 72 in the eighth embodiment is covered with a sixth insulation film 84 that also covers the fourteenth and the fifteenth trap layers 84a and 84b. The fourteenth and the fifteenth trap layers 84a and 84b may be conductive material layers that have a predetermined trap density, for example, silicon trap layers or germanium trap layers similar to the ninth through twelfth trap layers 68a through 68d of the sixth embodiment of FIG. 8.

Figure 11:
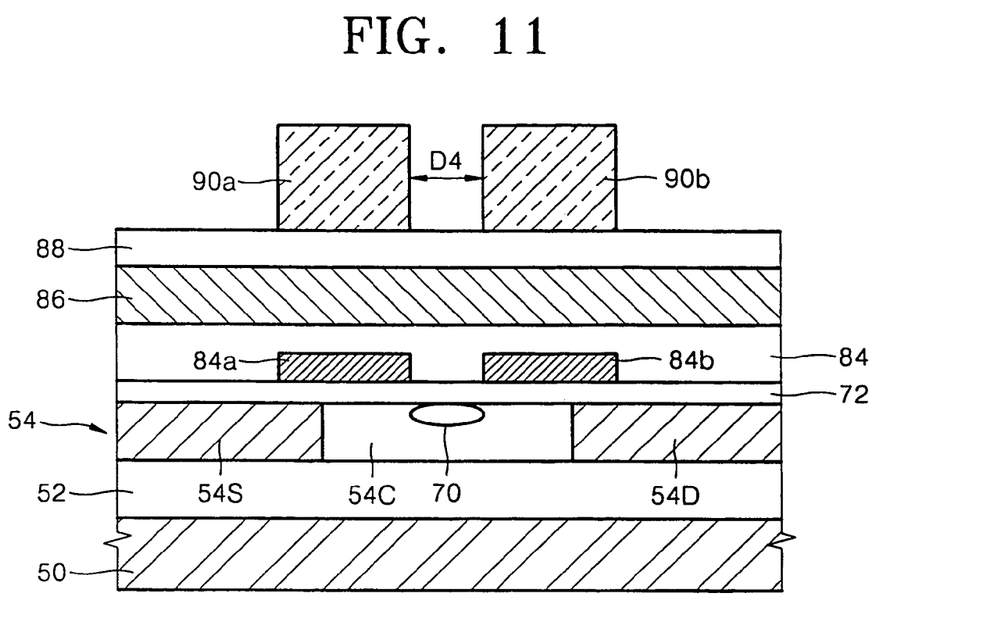

In a single electron transistor according to a ninth embodiment of the present invention, the structure ranging from a first substrate 50 to a third insulation film 72 is the same as those of the seventh and eighth embodiments shown in FIGS. 9 and 10, respectively. Referring to FIG. 11, in the ninth embodiment of the present invention, fourteenth and fifteenth trap layers 84a and 84b are formed on portions of the third insulation film 72, and a sixth insulation film 84 covering the fourteenth and fifteenth trap layers 84a and 84b is formed on the remaining portion of the third insulation film 72. The surface of the sixth insulation film 84 is flat, and a lower gate 86 is formed to a predetermined thickness on the flat surface of the sixth insulation film 84. A seventh insulation film 88 is formed on the lower gate 86, and first and second upper gates 90a and 90b are formed on the seventh insulation film 88. The sixth and seventh insulation films 84 and 88 are preferably silicon oxide films. The first and second upper gates 90a and 90b are used when the fourteenth and fifteenth trap layers 84a and 84b are charged with electrons. Upon electron charging of the trap layers 84a and 84b, a predetermined voltage, e.g., about 20V to 30V, is applied to the first and second upper gates 90a and 90b. The first upper gate 90a is formed on a portion of the seventh insulation film 88 above a portion of the source region 54S and an adjacent portion of the channel region 54C, and the second upper gate 90b is formed on a portion of the seventh insulation film 88 above a portion of the drain region 54D and an adjacent portion of the channel region 54C. The first and second upper gates 90a and 90b are separated from each other by a fourth interval D4 corresponding to the size of the fourth quantum dot 70 in the channel region 54C, and the fourth interval D4 is aligned with the fourth quantum dot 70.

Figure 12:
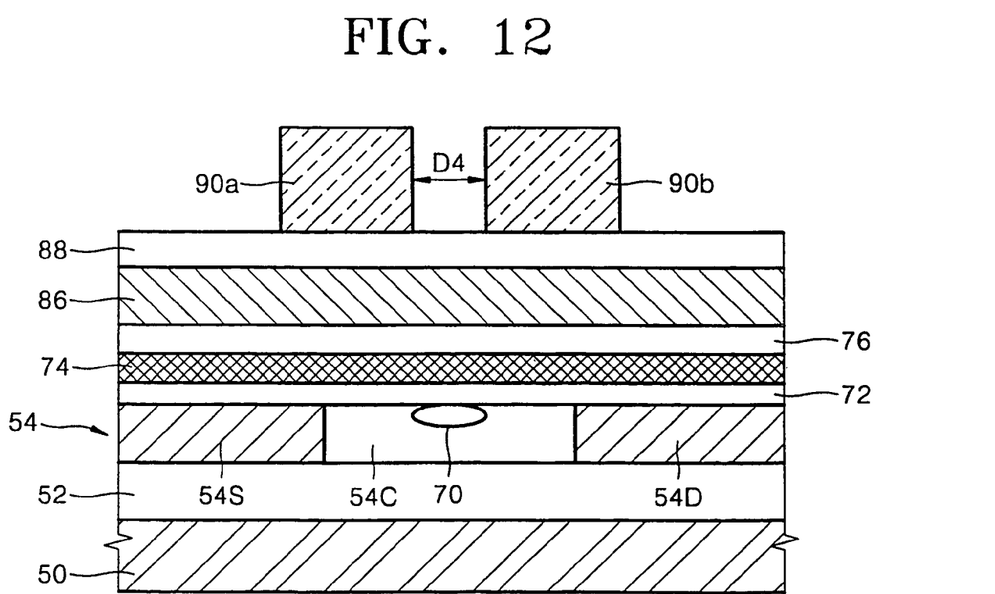

Referring to FIG. 12, in a single electron transistor according to a tenth embodiment of the present invention, the thirteenth trap layer 74, instead of the fourteenth and fifteenth trap layers 84a and 84b in the ninth embodiment, is formed on the entire surface of the third insulation film 72. The fourth insulation film 76 is formed on the entire surface of the thirteenth trap layer 74. The remaining structure of the tenth embodiment is the same as that of the single electron transistor according to the ninth embodiment of the present invention shown in FIG. 11. The thirteenth trap layer 74 is preferably a nitride layer or a ferro-dielectric layer such as PZT. The thirteenth trap layer 74 may also be a layer selected from the group consisting of conductive material layers including a conductive silicon layer and a conductive germanium layer.

FIG. 13A shows a valence band energy barrier Ev and a conduction band energy barrier Ec formed in the channel region 54C when the trap layers of the single electron transistors according to the first through tenth embodiments are not charged with electrons. FIG. 13b shows a valence band energy barrier Ev and a conduction band energy barrier Ec formed in the channel region 54C when the trap layers of the single electron transistors are charged with electrons.

Referring to FIG. 13A, when the trap layers 62a and 62b, which correspond equally to trap layers of all embodiments of the present invention, are not charged with electrons, no energy barrier is formed in the channel region 54C.

However, as shown in FIG. 13B, as the trap layers 62a and 62b are charged with electrons, represented by 62a' and 62b', energy barriers are formed in the channel region 54C under resultant trap layers 62a' and 62b'. As the trap layers 62a and 62b of FIG. 13A are charged with electrons, quantum dots are also formed in the channel region 54C between the charged trap layers 62a' and 62b' of FIG. 13B. Hence, the quantum dots are surrounded by energy barriers. This is equivalent to a case where potential wells are formed in quantum dots.

When the trap layers 62a and 62b are charged with electrons to be 62a' and 62b' and, accordingly, energy barriers are formed around the quantum dot 56 of FIG. 5, n energy levels E1 through En are formed in the quantum dot 56 as shown in FIG. 13B. If a voltage applied to the gate electrode 60 after the trap layers 62a' and 62b' are charged with electrons corresponds to one of the energy levels E1 through En, electrons passing through the energy barriers are found in the channel region 54C. In other words, current flows between the source and drain regions 54S and 54D.

However, if the voltage applied to the gate electrode 60 does not correspond to any of the energy levels E1 through En, the single electron transistors according to the present invention enter an 'off' state, and accordingly, no current flows between the source and drain regions 54S and 54D.

As described above, because the single electron transistors according to the present invention operate only when the applied gate voltage corresponds to one of the energy levels E1 through En of the quantum dot, a gate voltage that enables the single electron transistors to operate is quantized like the energy levels formed in the quantum dot.

The heights of the energy barriers of FIG. 13B vary depending on the number of electrons trapped in the trap layers 62a' and 62b'. For example, as the number of trapped electrons decreases, the heights of the energy barriers become smaller. As the number of trapped electrons increases, the heights of the energy barriers become larger.

If the heights of energy barriers vary depending on the number of trapped electrons, the energy level of a quantum dot also varies. Consequently, a gate voltage that enables a single electron transistor according to the present invention to operate is also shifted.

If this characteristic is used, a single electron transistor can have a memory function. Since the energy level of a quantum dot depends on the heights of the energy barriers, the single electron transistors according to the present invention may be used as memory devices with multiple states where the number of energy levels of the quantum dot is controlled.

The inventor(s) of the present invention measured a capacitance and an oscillation period voltage (a turn-on voltage) between the gate electrode 60 and the quantum dot 56 of, for example, FIG. 5, to ascertain that a single electron transistor according to the present invention is charged, that is, an electron trapping effect exists in the device of the present invention. The capacitance and the oscillation period voltage are expressed as Equations (1) and (2), respectively:

$$C_{cg} = \varepsilon_{\varepsilon SiO2} W_{ch} \frac{S_{cg}}{T_{cg}} \quad (1)$$

$$\Delta V_{cg} = \frac{q}{C_{cg}} \quad (2)$$

In equation 1, $C_{cg}$ denotes a capacitance, $\varepsilon_{SiO2}$ denotes the permittivity of a dielectric layer (i.e., a $SiO_2$ layer) existing between the gate electrode 60 and the quantum dot 56, $W_{ch}$ denotes the width of a channel region, $S_{cg}$ denotes the interval between the trap layers 62a and 62b (FIG. 5), and $T_{cg}$ denotes the thickness of the dielectric layer between the gate electrode 60 and the quantum dot 56 of FIG. 5. In Equation 2, 'q' denotes the number of electrons trapped in a trap layer.

Table 1 presents the capacitances and oscillation period voltages of single electron transistors according to the present invention that were measured using Equations 1 and 2 when the width ($W_{ch}$) of the channel region is 30 nm and the thickness of the dielectric layer $T_{cg}$ between the gate electrode and the quantum dot is 60 nm.)

TABLE 1

| $S_{ch}$ (nm) | $C_{cg}$ (aF) | $\Delta V_{cg}$ (mV) |
|---|---|---|
| 40 | 0.24 | 667 |
| 90 | 0.76 | 211 |
| 140 | 1.3 | 123 |
| 200 | 1.86 | 86 |

Referring to Table 1, as the interval ($S_{ch}$) between the trap layers 62a and 62b, that is, the size of the quantum dot 56, decreases, the capacitance $C_{cg}$ decreases, while the oscillation period voltage ($\Delta V_{cg}$) at which the single electron transistors are turned 'on,' increases. This means that the smaller the interval ($S_{ch}$) between the trap layers 62a and 62b, the better the single electron transistor effect is.

Figure 14:
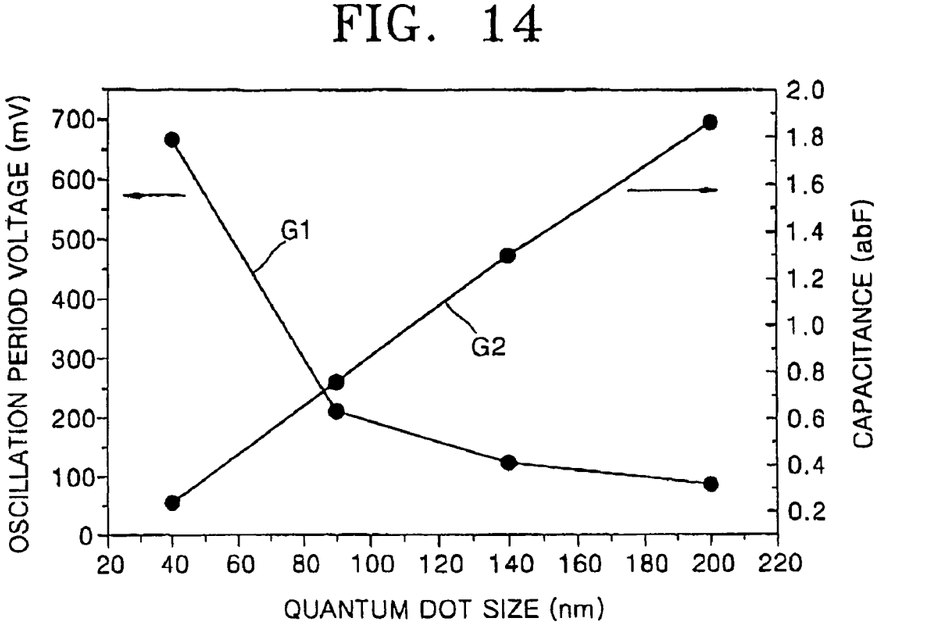
FIG. 14 is a graph showing variations in an oscillation period voltage and a capacitance with respect to the size of a quantum dot of a single electron transistor having a memory function according to an embodiment of the present invention.
Figure 15:
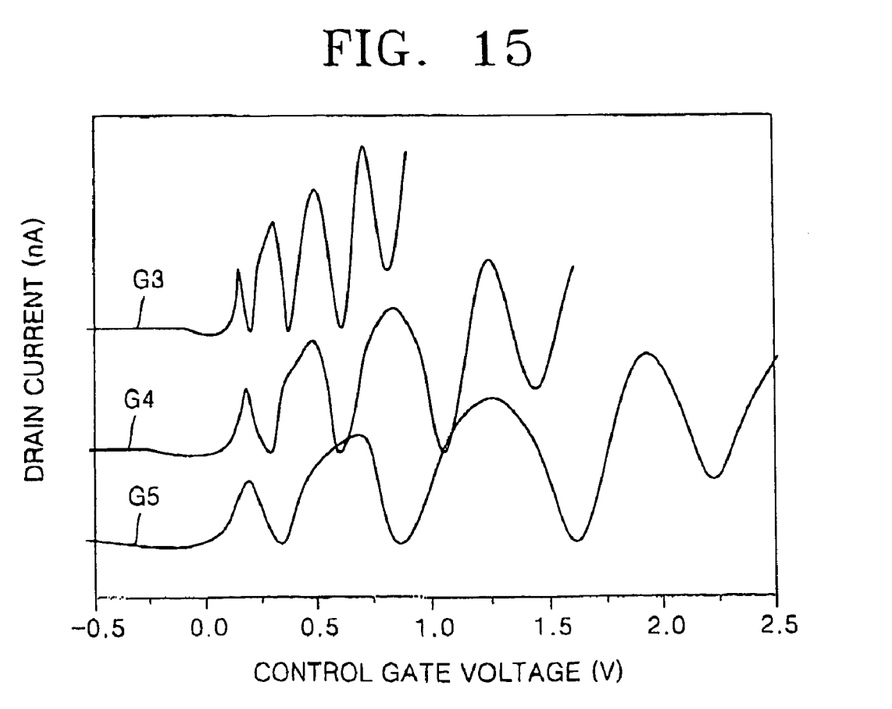
FIG. 15 is a graph showing variations in a drain current with respect to a control gate voltage applied to a single electron transistor having a memory function according to an embodiment of the present invention.

The results of the above measurements are shown in FIGS. 14 and 15.

Referring to FIG. 14, graphs G1 and G2, respectively, present variations in an oscillation period voltage ($\Delta V_{cg}$) and a capacitance ($C_{cg}$) with respect to the size of the quantum dot 56, equivalently, the interval ($S_{ch}$) between the trap layers 62a and 62b. Referring to FIG. 15, third through fifth graphs G3, G4, and G5 present variations in a drain current (nA) with respect to a control gate voltage (V) when the interval ($S_{ch}$) between the traps 62a and 62b is 140 nm, 90 nm, and 40 nm, respectively.

Referring to the third through fifth graphs G3, G4, and G5 of FIG. 15, a drain current peak periodically appears every time the control gate voltage increases by the oscillation period voltage ($\Delta V_{cg}$) starting from the time when the first drain current peak appears.

As described above, it may be deduced from this phenomenon that the gate voltage applied to a single electron transistor according to the present invention has been quantized.

Figure 16:
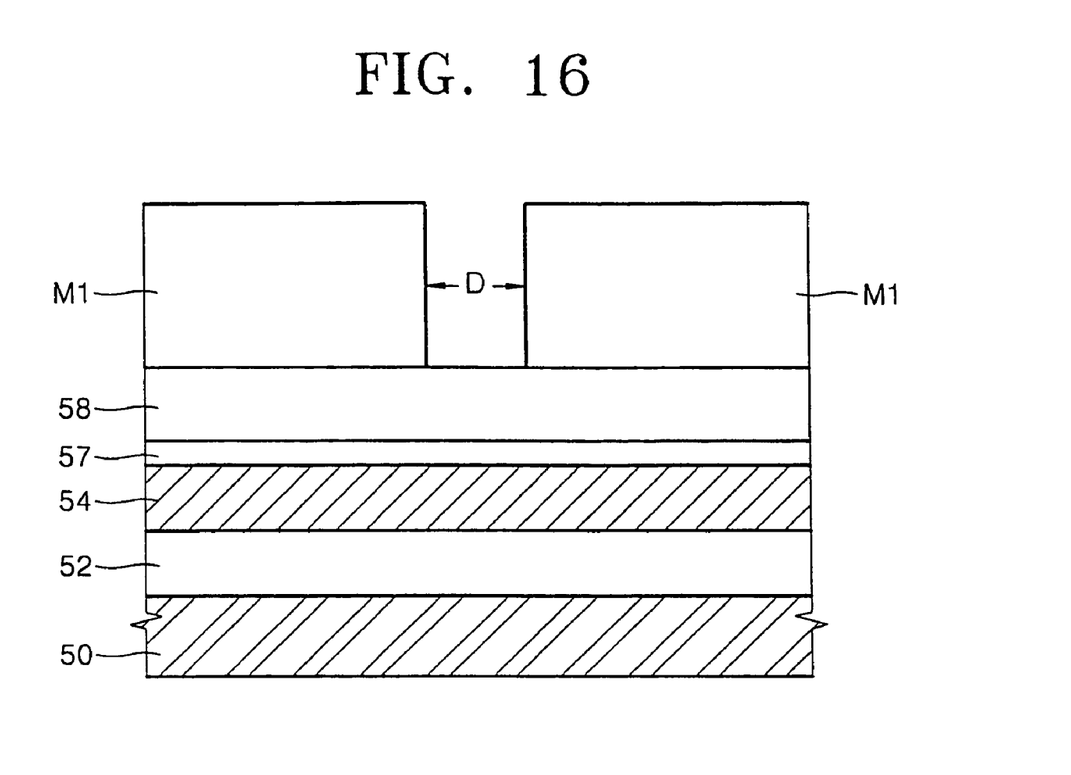
FIGS. 16 through 20 illustrate cross-sectional views for showing a method of fabricating a single electron transistor having a memory function according to an embodiment of the present invention.

A method of fabricating a single electron transistor according to an embodiment of the present invention will now be described with reference to FIGS. 16 through 20. Referring to FIG. 16, a first insulation film 52, a second substrate 54, a second insulation film 57, and a trap material layer 58 are sequentially formed on a first substrate 50. The second substrate 54 is preferably doped with impurities of a first conductivity type. The first and second insulation films 52 and 57 are preferably formed of silicon oxide, and the trap material layer 58 is a dielectric or conductive layer having a predetermined trap site, e.g., a trap site of $10^{12}/cm^2$ or greater. If the trap material layer 58 is a dielectric layer, it is preferably formed of silicon nitride or PZT, but may be formed of other dielectric materials. If the trap material layer 58 is a conductive layer, it is preferably formed of conductive silicon or germanium, but may be formed of other conductive materials.

Next, the trap material layer 58 is covered with a photosensitive film (not shown). The photosensitive film is patterned by a typical photolithographic process to form first photosensitive film patterns M1 on the trap material layer 58. The first photosensitive film patterns M1 are separated from each other by a distance (D) and accordingly expose a portion of the trap material layer 58. Thereafter, the exposed portion of the trap material layer 58 is etched out using the first photosensitive film pattern M1 as an etch mask until the second insulation film 57 is exposed. At this time, the shape of the first photosensitive film patterns M1 is transcribed onto the trap material layer 58 without being changed. Since the distance (D) between the first photosensitive film patterns M1 determines the size of a quantum dot to be formed in the second substrate 54, the distance (D) is preferably greater than 0 and equal to or smaller than 100 nm (i.e., $0 < D \leq 100$ nm). After the exposed portion of the trap material layer 58 is removed, the first photosensitive film patterns M1 are also removed.

Figure 17:
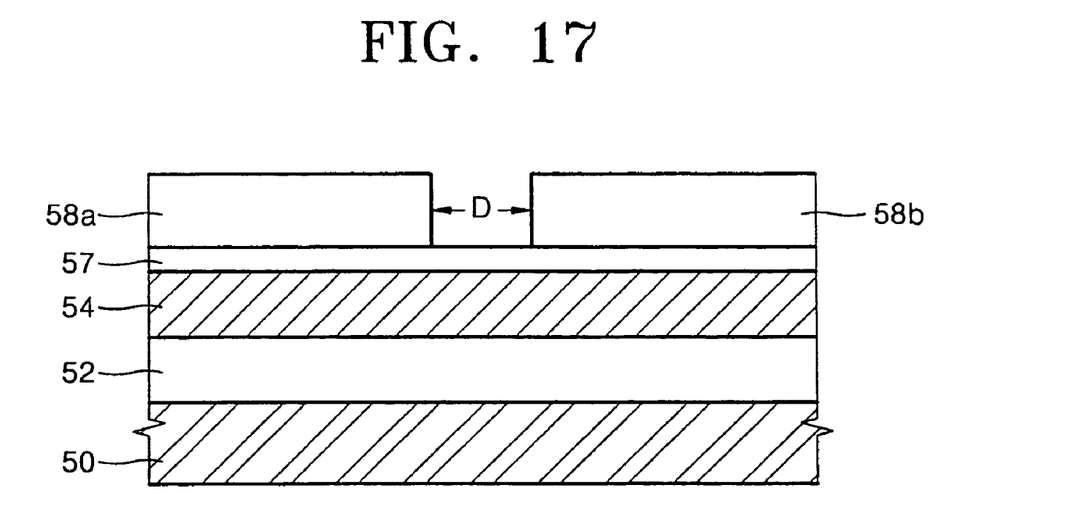

FIG. 17 illustrates a cross-sectional view of the resultant structure after the first photosensitive film patterns M1 are removed. Referring to FIG. 17, first and second trap layers 58a and 58b, separated from each other by a distance (D) corresponding to the distance (D) between the film patterns M1, are formed on the second insulation film 57 by etching of the trap material layer 58.

Figure 18:
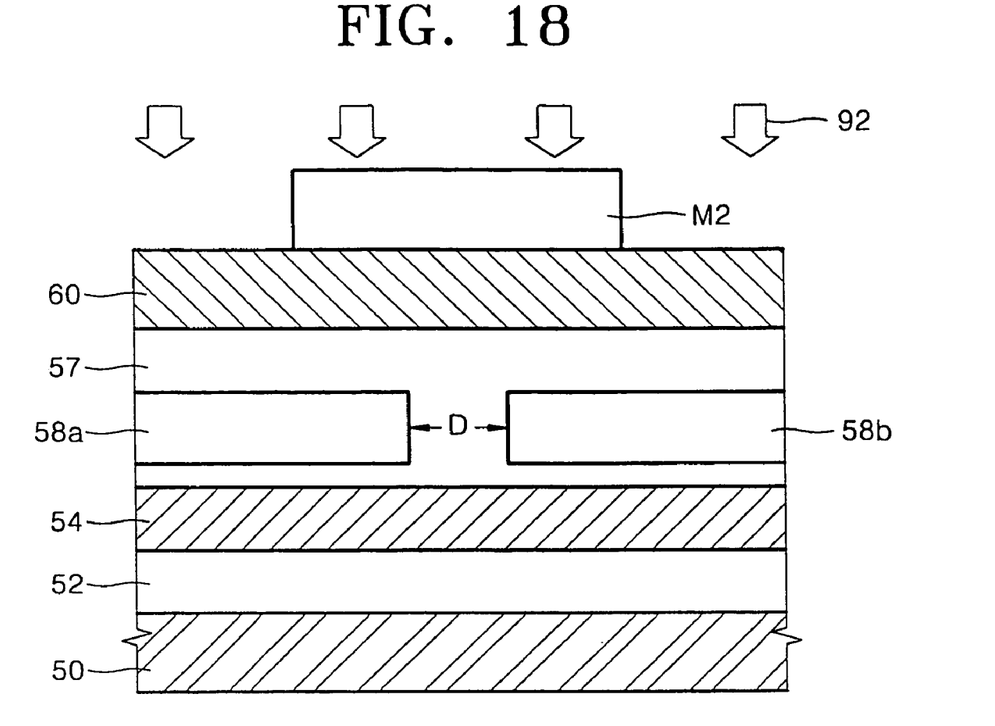
Figure 19:
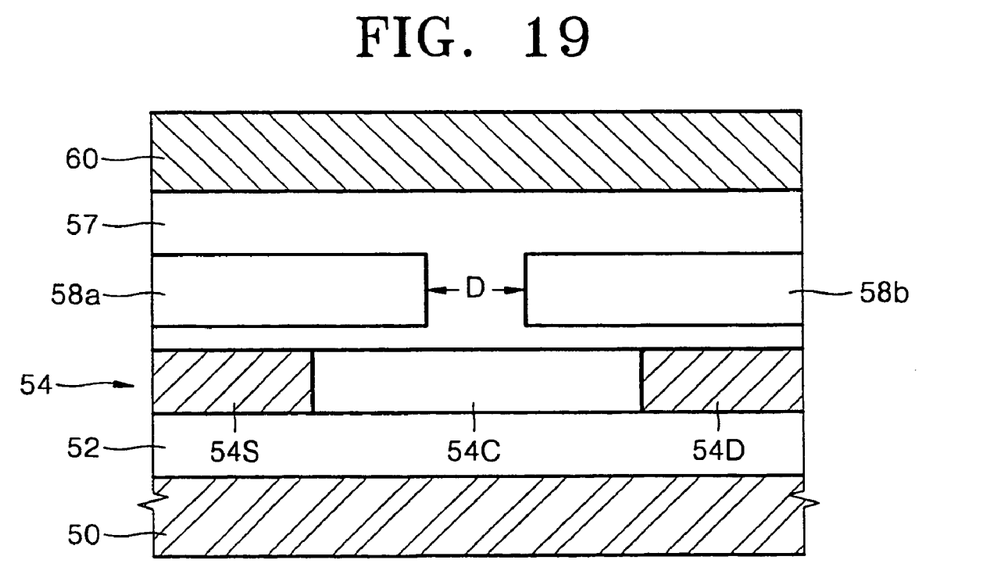

Referring to FIG. 18, the second insulation film 57 is further grown over and between the first and second trap layers 58a and 58b to a predetermined thickness, and the surface of the grown second insulation film 57 is planarized. However, the second insulation film 57 need not be further grown, as shown in FIGS. 3 and 6. A gate electrode 60 is formed to a predetermined thickness on the planarized surface of the second insulation film 57. The gate electrode 60 may, however, be formed on the trap layers as shown in FIGS. 3 and 6. A second photosensitive film pattern M2 is then formed on the gate electrode 60 to form source and drain regions 54S and 54D of FIG. 19 in the second substrate 54. Then, conductive impurities 92, for example, impurities of a second conductivity type that is opposite to the first conductivity type impurities with which the second substrate 54 is doped, are ion implanted into the entire surface of the resultant structure on which the second photosensitive film pattern M2 is formed. Preferably, the second photosensitive film pattern M2 is formed on a predetermined area of the gate electrode 60 so that the center of the second photosensitive film pattern M2 is located over the distance D between the first and second trap layers 58a and 58b. Because the ion implantation is performed to form source and drain regions in the second substrate 54, the ion implantation is preferably performed at an energy that enables the conductive impurities 92 to sufficiently reach the second substrate 54. Thereafter, the second photosensitive film pattern M2 is removed. As shown in FIG. 19, a channel region 54C is formed in an area of the second substrate 54 that corresponds to the second photosensitive film pattern M2, and the source and drain regions 54S and 54D are formed on both sides of the channel region 54C.

Figure 20:
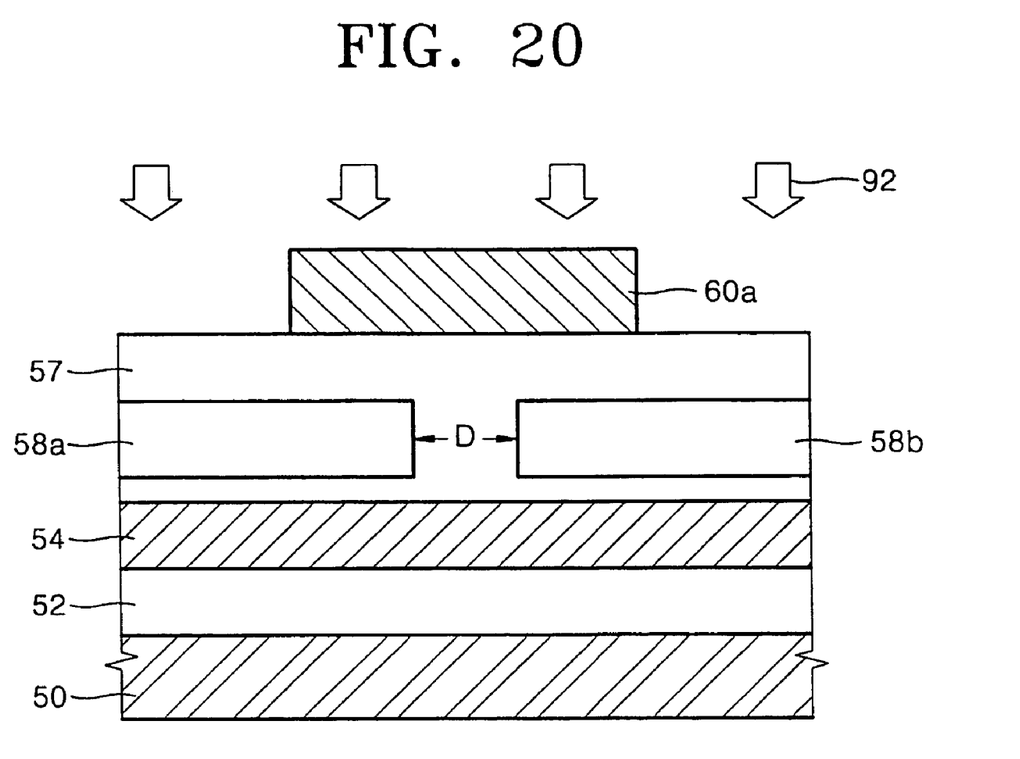

Alternatively, as shown in FIG. 20, the source and the drain regions 54S and 54D of FIG. 19 may be formed in the second substrate 54 by forming a gate electrode pattern 60a on an area of the second insulation film 57 that corresponds to the channel region 54C of FIG. 19 and then ion-implanting the conductive impurities 92 into the entire surface of the resultant structure on which the gate electrode pattern 60a has been formed. Here, the ion implantation energy of the conductive impurities 92 is the same as that described above with reference to FIG. 18.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, a gate electrode may only be formed on one of trap layers, and the trap layers may be different dielectric or conductive layers. Also, a process of thinning a substrate may be included before a tunnelling oxide film is formed on an SOI substrate, which is comprised of insulation films and a substrate (or a semiconductor layer).

As described above, in a single electron transistor according to the present invention, trap layers are formed using a complimentary metal oxide semiconductor (CMOS) process. Thus, the trap layers may be accurately separated from each other by a predetermined distance, and a high reproducibility may be maintained. This means that the quantum dots of a uniform size may be accurately formed in predetermined areas thereby increasing the reproducibility. In addition, because the single electron transistor according to the present invention has a single gate in contrast with the prior art, the single electron transistor according to the present invention consumes low power and is simple to fabricate. Thus, the circuit structure of the single electron transistor according to the present invention may be simpler than that of conventional single electron transistors.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a single electron transistor, the method comprising:

providing a substrate having a source region, a channel region, and a drain region;

forming a trap layer on the substrate;

forming a gate electrode opposite the trap layer, wherein at least one of the gate electrode and the trap layer has an interval therein such that at least one quantum dot having the same size as the interval can be formed in the channel region, wherein a portion of the gate electrode across the interval has a flat surface having a same width as the quantum dot in the interval and wherein the gate electrode includes conductive spacers separated by the interval, the trap layer being separated from the conductive spacers; and forming an insulation film between the trap layer and the substrate, wherein the trap layer and the insulation film have a same thickness.

2. The method as claimed in claim 1, wherein the trap layer includes at least two trap sections separated by the interval.

3. The method as claimed in claim 2, further comprising forming a tunneling film between the substrate and the trap sections.

4. The method as claimed in claim 2, further comprising forming an insulation film on and between the at least two trap sections.

5. The method as claimed in claim 1, further comprising forming a lower gate continuously on the trap layer, wherein the gate electrode include at least two upper gates formed on an insulation film to be separated from each other by the interval.

* * * * *